United States Patent [19]

Beasom

[11] Patent Number: 5,283,461
[45] Date of Patent: Feb. 1, 1994

[54] TRENCH CONDUCTOR AND CROSSUNDER ARCHITECTURE

[75] Inventor: James D. Beasom, Melbourne, Fla.

[73] Assignee: Harris Corporation, Melbourne, Fla.

[21] Appl. No.: 916,198

[22] Filed: Jul. 17, 1992

Related U.S. Application Data

[62] Division of Ser. No. 738,532, Jul. 31, 1991, Pat. No. 5,196,373, which is a division of Ser. No. 563,276, Aug. 6, 1990, Pat. No. 5,057,895.

[51] Int. Cl.⁵ .................. H01L 29/06; H01L 23/48
[52] U.S. Cl. ........................ 257/508; 257/520; 257/621; 257/622
[58] Field of Search ............. 257/621, 622, 301, 302, 257/303, 304, 508, 520

[56] References Cited

U.S. PATENT DOCUMENTS

| | | | |
|---|---|---|---|
| 4,503,451 | 3/1985 | Lund et al. | 257/622 |
| 4,920,389 | 4/1990 | Itoh | 257/302 |
| 4,939,567 | 7/1990 | Kenney | 257/622 |
| 4,953,125 | 8/1990 | Okumura et al. | 257/304 |
| 4,977,439 | 12/1990 | Esquivel et al. | 257/621 |
| 5,070,388 | 12/1991 | Wade et al. | 257/621 |

FOREIGN PATENT DOCUMENTS

0228320A1 7/1987 European Pat. Off. .
0307844A2 3/1989 European Pat. Off. .

OTHER PUBLICATIONS

"Two-Level Interwiring for Monlithic Circuits" by D. K. Seto and J. Regh; *IBM Technical Disclosure Bulletin*, vol. 9, No. 6 Nov., 1966, pp. 579-580.

"Coplamos Keeps N-Channels in Line" by Paul Richman and James A. Hayes; *Electronics*, vol. 15, No. 10; May 8, 1972.

"N+ Multiple Underpass Device" by C. A. Price and J. W. Wolf; *IBM Technical Disclosure Bulletin*, vol. 19, No. 7, Dec., 1976, pp. 2598-2599.

*Primary Examiner*—Rolf Hille
*Assistant Examiner*—Robert Limanek
*Attorney, Agent, or Firm*—Charles E. Wands

[57] ABSTRACT

The trench pattern of a dielectrically isolated island architecture is filled with doped polysilicon and used as an interconnect structure for circuit devices that are supported within the islands, thereby decreasing the amount of topside interconnect and reducing the potential for parasitics beneath tracks of surface metal. The trench pattern may serve as a voltage distribution network or provide crossunders beneath surface tracks. In addition, at least one of the islands may contain one or more auxiliary poly-filled trench regions to perform the crossunder function. Such an auxiliary trench region may be also provided in an island that contains a circuit device. Manufacture of the conductor-filled trench structure may be facilitated by depositing polysilicon over a dielectrically coated trench grid structure and then planarizing the polysilicon to the surface of the oxide dielectric. The exposed polysilicon is doped and then oxidized to seal the dopant, which forms a thin oxide layer on the poly. The oxide dielectric for the trench can then be selectively patterned to form a mask to be for the initial doping of the islands.

6 Claims, 5 Drawing Sheets

TRENCH CONDUCTOR AND CROSSUNDER ARCHITECTURE

This is a division of U.S. patent application Ser. No. 738,532, filed Jul. 31, 1991, now U.S. Pat. No. 5,196,373, which is a divisional of U.S. patent application Ser. No. 563,276, filed Aug. 6, 1990, now U.S. Pat. No. 5,057,895, to James D. Beasom, for "Trench Conductor and Crossunder Architecture."

FIELD OF THE INVENTION

The present invention relates in general to trench isolation integrated circuit architectures and is particularly directed to a scheme for using trench structures as conductor links among dielectrically isolated island components.

BACKGROUND OF THE INVENTION

Trench isolation is a commonly employed scheme for achieving sidewall isolation in a variety of semiconductor architectures, such as silicon on insulator (SOI), including separation by implanted oxygen (SIMOX) and bonded wafer technologies, as well as PN junction isolation structures. Within the semiconductor wafer (e.g. silicon substrate), the trench is coated with an insulator material, typically oxide, and filled with a material such as polysilicon, which is often electrically floating. Although a bias voltage may sometimes be applied to the poly-fill material in order to control parasitic sidewall MOS devices (for which the polysilicon acts as a gate), the essential function of the trench is provide isolation among the islands of the substrate. Interconnect among circuit device regions is effected by way of in situ diffusions within the islands and conductor tracks overlying a topside insulator layer.

SUMMARY OF THE INVENTION

In accordance with the present invention, advantage is taken of the fact that the trench material is capable of being controlled (e.g. by selective doping or the addition of a metal layer structure), so that it may be used as an interconnect structure for circuit devices that are supported within the dielectrically isolated islands of the substrate, thereby decreasing the amount of topside interconnect and thus reducing the potential for parasitics beneath tracks of surface metal.

More particularly, in accordance with a first embodiment of the present invention, the trench structure is used to distribute one or more voltages to (dielectrically-isolated) islands of a semiconductor substrate. For this purpose, the substrate is subdivided by a continuous dielectric-coated trench grid pattern into a matrix of spaced-apart dielectrically isolated islands. Conductive material (e.g. doped polysilicon or polysilicon with a layer of resistivity-decreasing refractory material, such as a layer of tungsten) is formed in the dielectric-coated trench grid pattern and coupled to receive a prescribed voltage to be distributed throughout the wafer. Respective contact regions of islands that are to be electrically connected to the reference voltage are connected via local interconnects bridging oxide vias overlying the contact regions and adjacent locations in the trench grid pattern.

Where a single voltage is to be distributed throughout the matrix, the filled trench structure provides a continuous conductive power grid. Where more than one voltage is to be distributed, the filled trench structure is discontinuous, so that separate matrices are defined by isolated interconnect grid structures, each of which is coupled to receive a respective reference voltage. Again, as in the single voltage distribution configuration, respective contact regions of islands that are to be electrically connected to the reference voltages are connected via local interconnects bridging oxide vias overlying the contact regions and adjacent locations in the trench grid patterns.

In accordance with a second embodiment of the present invention, the conductive fill material of the trench is used to provide crossunders, i.e. interconnects that pass beneath and are electrically isolated from a surface conductor track, between regions of the same island or regions of separate islands. For this purpose, as in the first embodiment, the substrate is subdivided by a dielectric-coated trench grid pattern into a plurality of spaced-apart dielectrically isolated islands. Where contact is to be provided between spaced-apart regions of the same island or respective regions of different islands, between which a surface conductor is formed, conductive material is formed in at least that first portion of the dielectric-coated trench pattern that underlies the surface conductor and extends to respective locations in the trench pattern that are adjacent to the spaced-apart regions. Respective contact regions of the island or islands that are to be electrically interconnected are connected to the conductive material in the trench via local interconnects bridging oxide vias overlying the contact regions and the adjacent locations in the trench.

In accordance with a third embodiment of the invention, in addition to the semiconductor substrate being subdivided by a dielectric-coated trench pattern into a plurality of spaced-apart dielectrically isolated islands, at least one of the islands itself has one or more auxiliary dielectric-coated trench regions containing conductive material that is to perform the crossunder function. Namely, a surface conductor overlies the surface of the one or more auxiliary trench regions in the one island between spaced apart locations of the island, so that the crossunder extends between the spaced apart island locations. Respective conductive layers provide electrical connections to these spaced-apart locations of the auxiliary trench regions and other portions of the circuit. In accordance with a modification of this embodiment, such an auxiliary trench region may be also provided in an island that contains a circuit device (e.g. a bipolar transistor).

Manufacture of the conductor-filled trench structure may be facilitated by non-selectively forming polysilicon over a dielectrically coated trench grid structure and then planarizing the polysilicon to the surface of the oxide dielectric which protects top and side surfaces of the island architecture. The exposed polysilicon is then doped and then oxidized to seal the dopant, which forms a thin oxide layer on the poly. The oxide dielectric for the trench can then be selectively patterned to form a mask to be for the initial doping of the islands, thus eliminating the conventional initial oxidation step, thereby simplifying the process.

DETAILED DESCRIPTION

As pointed out briefly above, pursuant to the invention, advantage is taken of the fact that all or selected portions of an island-defining, dielectrically coated trench grid network may contain conductive material (e.g. through selective doping of polysilicon and the addition of a resistance-reducing metal layer structure), so that the trench grid network may be used as an interconnect structure for circuit devices that are supported within the islands of the substrate, thus decreasing topside interconnect and reducing the potential for parasitics beneath tracks of surface metal.

Figure 1:
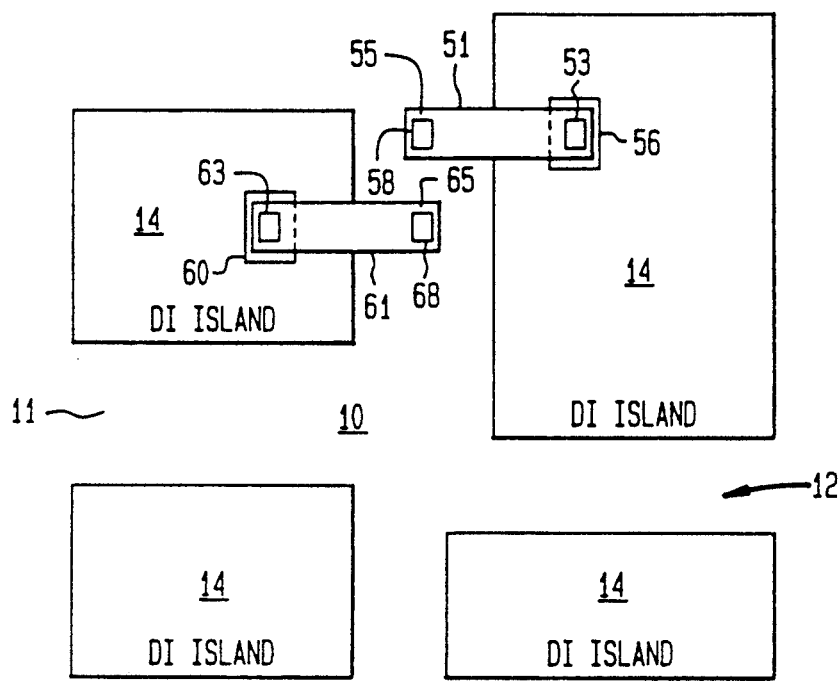
FIG. 1 diagrammatically illustrates a plan view of an embodiment of the invention used to distribute one or more voltages throughout a dielectrically isolated semiconductor architecture.
Figure 2:
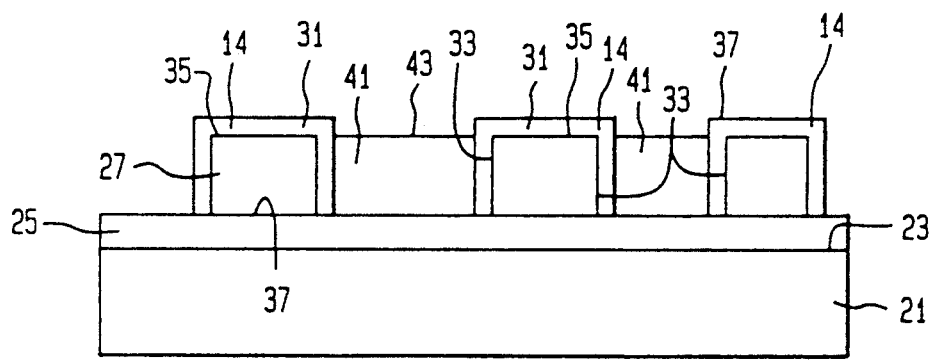
FIG. 2 diagrammatically shows, in cross-section, a silicon-on-insulator architecture, subdivided by a continuous dielectric-coated trench grid pattern into a matrix of spaced-apart dielectrically isolated islands.

In accordance with a first embodiment of the present invention, a trench grid network through which a matrix of dielectrically isolated semiconductor islands are defined may be used to distribute one or more voltages throughout the wafer. For this purpose, as diagrammatically illustrated in the plan view of FIG. 1, a semiconductor substrate (e.g. silicon wafer) 10 is subdivided by a continuous dielectric-coated trench grid pattern 11 into a matrix 12 of spaced-apart dielectrically isolated islands 14. For purposes of the present description, the substrate 10 is a silicon-on-insulator architecture, diagrammatically shown in FIG. 2 as containing an underlying support substrate 21, on a top surface 23 of which a layer of oxide 25 is formed. The trench grid pattern 11 through an overlying silicon layer 27 subdivides the layer into matrix 12 of isolated islands 14. A dielectric (e.g. silicon oxide) layer 31 is non-selectively formed on the trench grid network, so that the sidewalls 33 and top surfaces 35 of the islands 14 are dielectrically isolated from each other.

Figure 3:
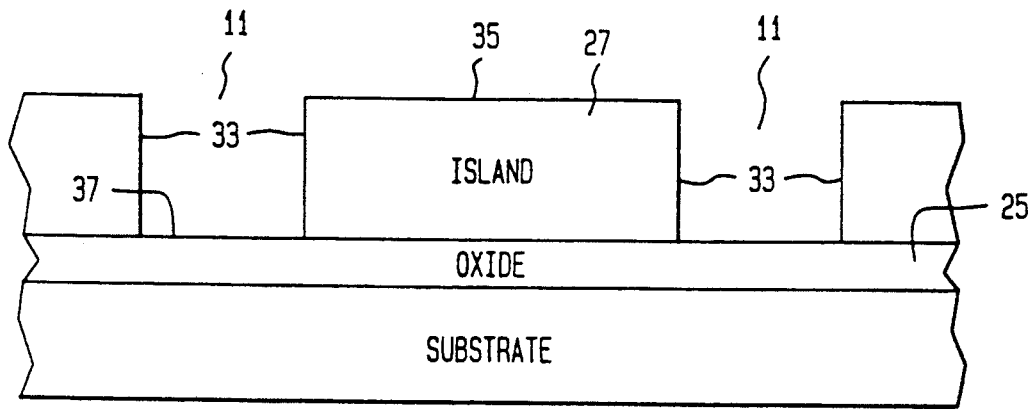
FIGS. 3–5 illustrate process steps carried out in the course of the non-selective deposition of polysilicon and planarization of a semiconductor wafer to provide a continuous network or grid structure of a material capable of being made conductive for the purpose of distributing a voltage through the island matrix or providing an interconnect path among island regions.
Figure 4:
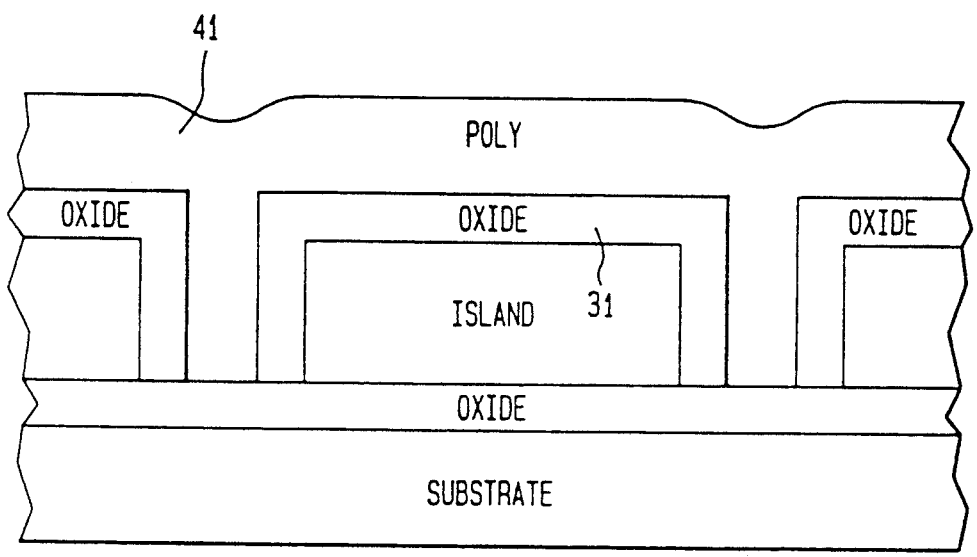

The remainder of the trenches are filled with a layer of polysilicon 41, for example by non-selective deposition of polysilicon and planarization down to the top surface 37 of oxide layer 31, as diagrammatically illustrated in FIGS. 3 and 4, so as to provide a continuous network or grid structure of a material capable of being made conductive for the purpose of distributing a voltage through the island matrix or providing an interconnect path among island regions.

Figure 5:
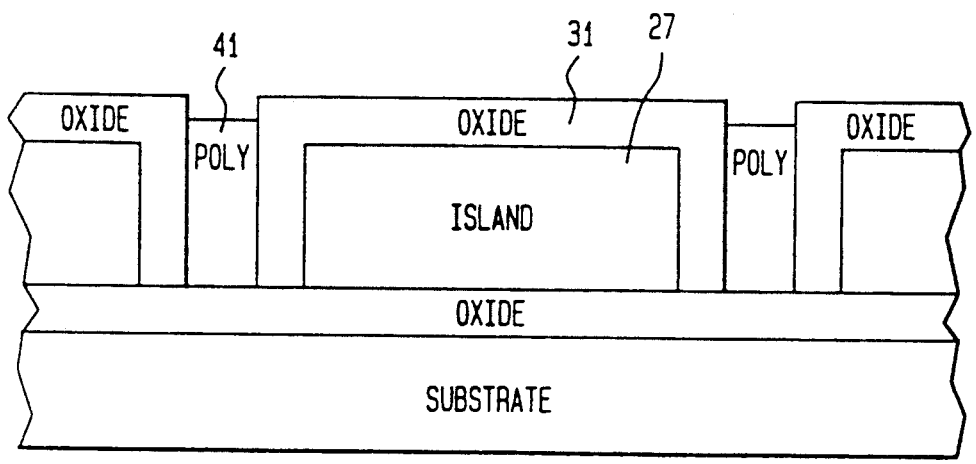

For this purpose, as shown in FIG. 5, polysilicon layer 41 may be doped by open tube deposition of a conductivity-defining impurity (e.g. phosphorous) though its exposed top surface 43, employing the oxide coating 31 as a mask, so that the dopant is introduced only into the polysilicon fill and not into the islands. As an option, where the dopant concentrations of island regions are permitted to correspond to that of the doped polysilicon, oxide layer 31 may be patterned to expose surface portions of the islands, where such regions are to be formed, during this dopant step. Customarily, however, oxide layer 31 is patterned after doping the poly-filled trench and thereby used as a masking oxide for the initial island-doping step. Still, use of oxide layer 31 for this purpose eliminates a separately needed initial oxidation step, thus simplifying the manufacturing process.

Figure 6:
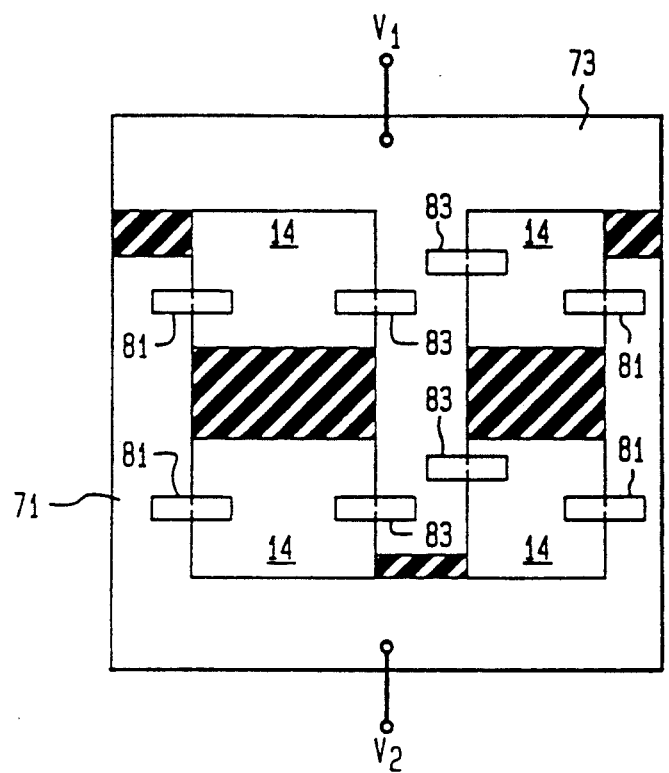
FIG. 6 diagrammatically shows the manner in which a trench structure may be selectively filled with conductive material so as to be discontinuous, so that separate interconnect grid patterns may be coupled to receive respective reference voltages for distribution to dielectrically isolated islands.

With attention again directed to FIG. 1, respective contact regions of islands 50, 60, that are to be electrically connected to a reference voltage carried by the doped poly fill material 41 of trench grid network 11, may be connected to the trench grid via local surface interconnect links 51, 61 bridging oxide vias 53,55 and 63,65, respectively overlying contact regions 50, 60 and adjacent locations 58,68 in the trench grid pattern. In this embodiment, where a single voltage is to be distributed throughout the matrix, the doped poly-filled trench grid 11 serves to provide a continuous conductive power grid.

Where plural voltages (e.g. +5 V and GND) are to be coupled to the islands of the matrix, the conductor-filled trench structure may be selectively filled with conductive material so as to be discontinuous, e.g. by the formation of an oxide isolation barrier region in the trench, so that separate interconnect grid patterns, as diagrammatically shown at 71, 73 in FIG. 6, may be coupled to receive respective reference voltages V1, V2 for distribution to the dielectrically isolated islands 14. As in the single voltage distribution configuration of FIG. 1, respective contact regions of islands that are to be electrically connected to the reference voltages are connected via local interconnects 81, 83 that bridge oxide vias overlying the contact regions and adjacent locations in the trench grid patterns 71, 73.

Figure 7:
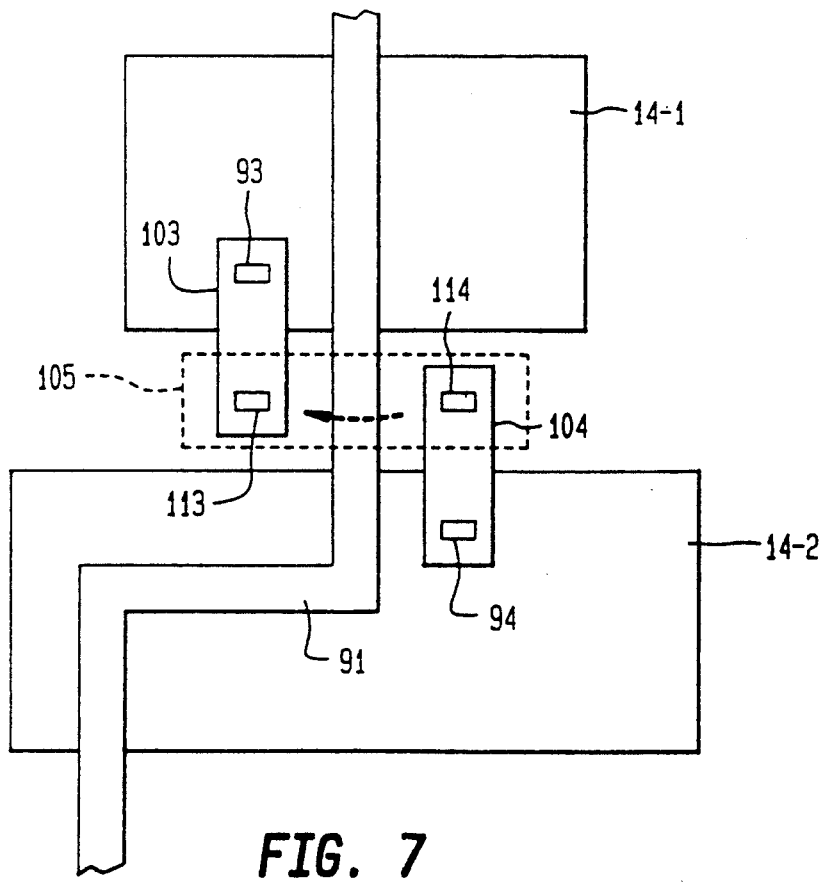
FIG. 7 is a diagrammatic plan view of a second embodiment of the present invention, in which the conductive fill material of the trench is used to provide cross-unders that pass beneath and are electrically isolated from a surface conductor layer.

FIG. 7 is a diagrammatic plan view of a second embodiment of the present invention, in which the conductive fill material of the trench is used to provide cross-unders, namely trench-resident conductive interconnects, that pass beneath and are electrically isolated from a surface conductor layer. The trench-resident interconnect may be joined to respective regions of the same island, regions of separate islands, or to one or more surface conductors (as in the case of the use of the trench-resident interconnect for joining voltage distribution conductors at the surface of the wafer).

More particularly, as shown in FIG. 7, a surface conductor layer 91 extends over the surface of the wafer between island regions 93, 94 that are to be conductively joined with one another. Although island regions 93 and 94 are shown in separate islands 14-1, 14-2 they could also be within the same island. In either case, the problem being addressed is the same; namely, a surface conductor layer 91 lies between them.

In order to provide a conductive interconnect between regions 93, 94 at least that portion 105 of the dielectric-coated trench pattern that underlies the surface conductor and extends to respective locations in the trench pattern that are adjacent to regions 93, 94 may be filled with doped polysilicon. Again, as in the architecture of FIG. 1, contact regions 93, 94 are connected to the conductive material in the trench via local interconnects 103, 104 bridging oxide vias overlying the contact regions and adjacent locations 113, 114 in the trench. One advantage in using the trench to provide crossunders is the fact that, as contrasted with conventional (island-resident) diffusion crossunders, the resistance of the trench crossunders can be reduced and the oxide (oxide layer 31, shown in FIG. 2) between the trench fill conductor 105 (doped polysilicon) and the overlying surface conductor 91 is thicker (on the order of one to two microns). The thicker oxide provides improved electrostatic discharge resistance, higher breakdown voltage and lower parasitic capacitance.

As noted above, although the use of the conductive trench polyfill as a crossunder is shown in FIG. 7 as extending only between a pair of island regions, use may be made of numerous portions of an entire continuous trench grid when the grid serves as a voltage bus to minimize voltage drops. In such an application, the trench conductor carries current only over the short distance where it functions as a crossunder.

Figure 8:
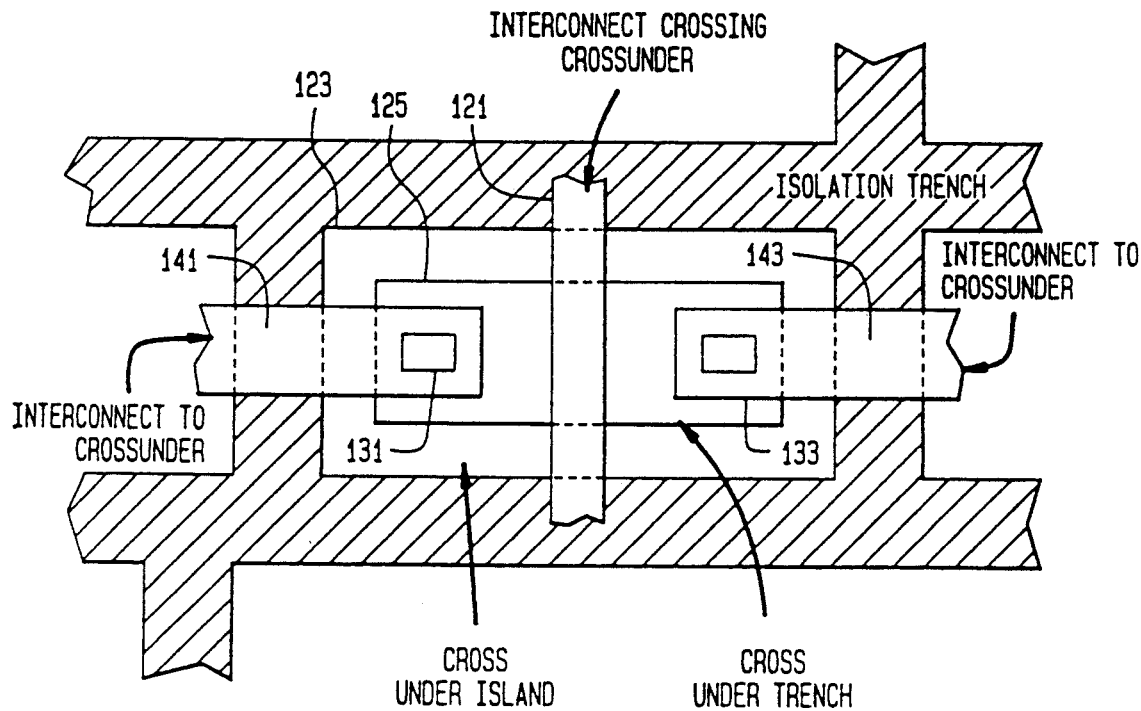
FIG. 8 shows a surface conductor overlying the surface of a dielectrically isolated island that contains an auxiliary poly-filled trench region passing beneath a conductor layer.
Figure 9:
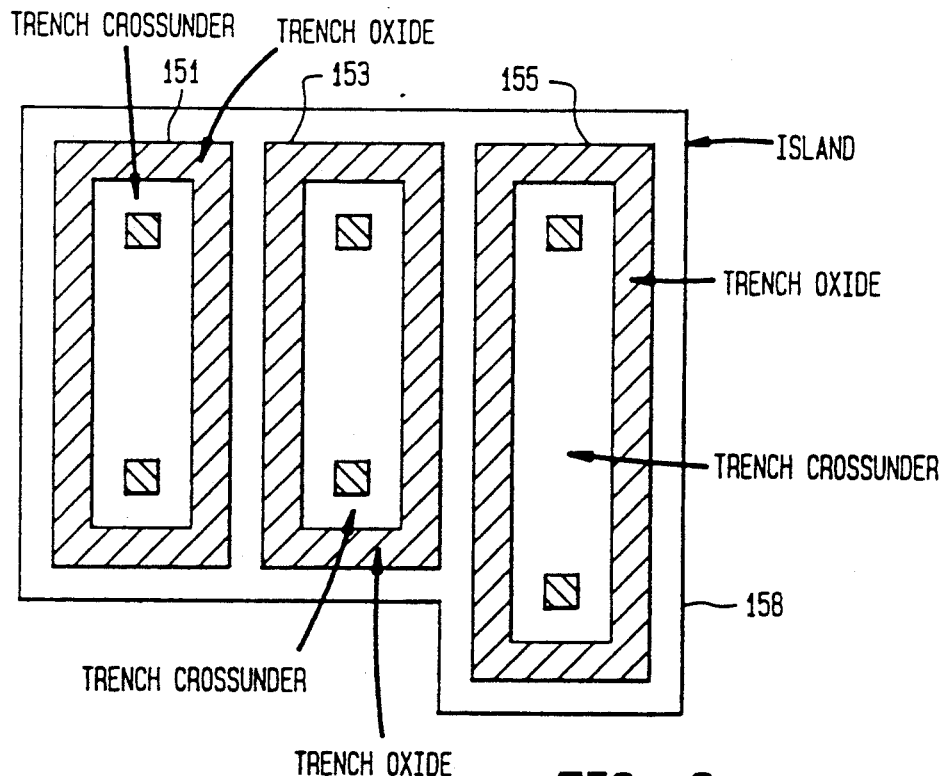
FIG. 9 shows the formation of a plurality of poly-filled trench regions in a dielectrically isolated island 158.
Figure 10:
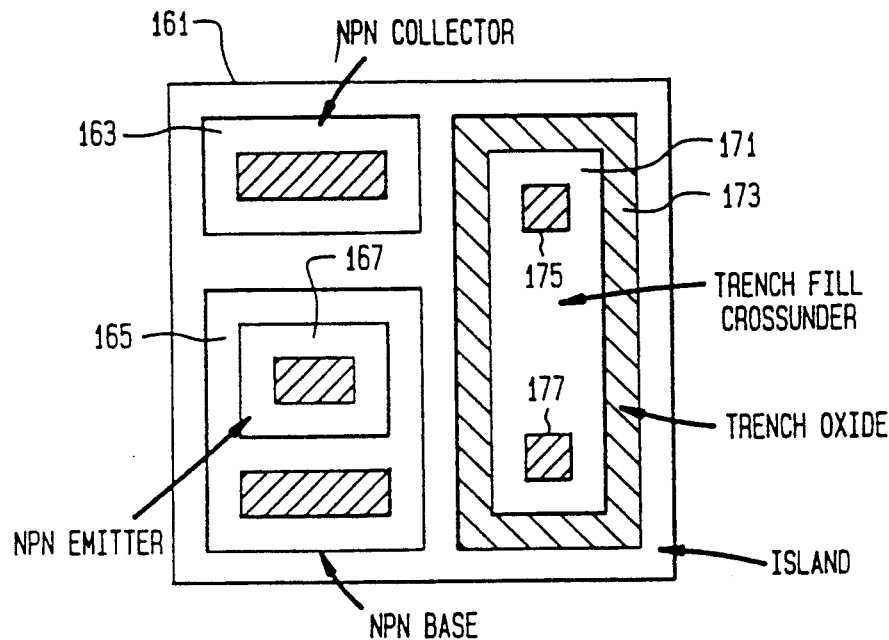
FIG. 10 shows a further embodiment of the present invention in which one or more auxiliary trench region is provided in an island that contains a circuit device.

FIGS. 8-10 are plan views of respective variations of a third embodiment of the invention, in which, in addition to the poly-filled trench, at least one of the dielectrically islands itself has one or more auxiliary dielectric-coated trench regions containing conductive material that may act as a crossunder. Namely, FIG. 8 shows the case of a surface conductor 121 overlying the surface of a dielectrically isolated island 123 that contains an auxiliary poly-filled trench region 125 passing beneath conductor 121. Ohmic contact apertures extend through a topside oxide layer to respective spaced-apart locations 131, 133 in trench region 125, so that a crossunder is provided by way of island 123 beneath surface conductor 121, thereby permitting a pair of surface tracks 141, 143 to be interconnected through island 123.

Although the auxiliary trench region-containing island 123 of FIG. 8 contains only a single poly-filled trench 125, more than one such trench region may be formed in an island as diagrammatically illustrated in FIG. 9, which shows a plurality of poly-filled trench regions 151, 153 and 155 in dielectrically isolated island 158. In accordance with a further modification of the embodiment, one or more of these auxiliary trench regions may be also provided in an island that contains a circuit device, such as a bipolar transistor, as diagrammatically illustrated in FIG. 10. In this example, the semiconductor material of an island 161 serves as the collector in which a surface collector contact region 163 and a spaced-apart, opposite conductivity type base region 165 are formed. An emitter region 167 is formed in base region 165. Adjacent to the transistor is an auxiliary, conductor-filled trench region 171, dielectrically isolated from the semiconductor material of the island 161 by trench oxide 173. A pair of contacts 175, 177 are provided at opposite ends of the trench so that it may serve as an island-resident crossunder. Because the conductive poly-fill of trench region 171 is surrounded by trench insulator, it can be placed close to (even touching, in many cases) the device diffusions without causing a reduction in device breakdown. In addition, this oxide isolation prevents both the possibility of a parasitic MOS device being formed between trench crossunder region 171 and the transistor and the possibility of four layer device operation (as there would be with a junction-isolated crossunder merged into a transistor island).

In the polysilicon deposition and doping process described above with reference to FIGS. 3-5, a trench conductor having a low resistivity on the order of one ohm per square, for a seventeen micron deep trench, has been obtained. Where a further increase in conductivity is desired, material such as a silicide (e.g. tungsten silicide) or a refractory metal (such as tungsten) may be deposited atop the trench fill material (e.g. doped polysilicon).

Figure 11:
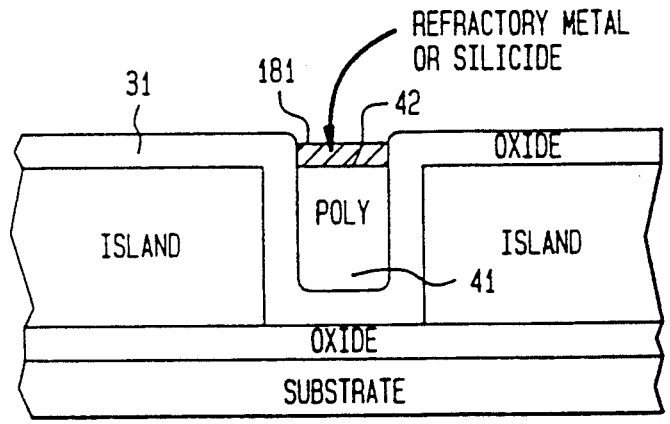
FIG. 11, shows a layer of refractory metal or silicide selectively deposited on only the top surface of a polysilicon layer.

For this purpose, as shown in FIG. 11, a layer 181 of refractory metal or silicide may be selectively deposited only the top surface 42 of the polysilicon 41 (which may be left undoped, although it is preferably doped in the manner described above), so that it is not necessary to remove excess material from non-trench regions. This deposited metal or silicide may thereafter be covered with an oxide for insulation. Alternatively, a sacrificial layer of polysilicon may be deposited atop layer 181, and then converted into oxide during subsequent oxidation treatments during wafer processing. If layer 181 is a silicide, such as tungsten silicide, no additional overcoat layer is required for insulation, as an oxide layer will form atop the silicide during further processing.

Figure 12:
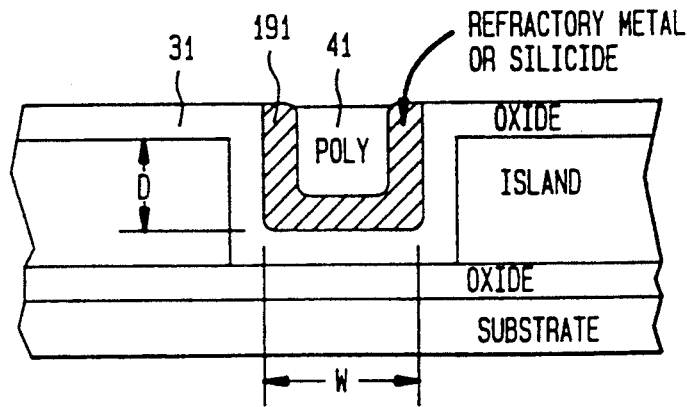
FIG. 12 shows the manner of making refractory metal or silicide layer conformal with the bottom and sidewalls of a trench.

The conductivity of the trench poly can be especially improved by forming the refractory metal or silicide layer so that it is conformal with the bottom and sidewalls of the trench, as shown at 191 in FIG. 12. The effective width of the conductor then becomes the sum of twice the depth D and the width W of the trench, rather than just the width of the trench as in the top surface configuration of FIG. 11. As a result the resistance of the trench fill will be reduced by the ratio of the widths, which is typically greater than three. In addition, if the trench is sufficiently narrow, it may be filled entirely with metal or silicide, rather than the poly/metal (or silicide) combination. Moreover, other resistance reduction combinations, such as a laminate of multiple layers of poly and metal or silicide may be used to form the trench conductor.

As will be appreciated from the foregoing description, pursuant to the present invention, advantage is taken of availability of dielectrically isolated trench fill, which may be selectively doped so that it may be used as an interconnect structure for circuit devices that are supported within the dielectrically isolated islands of an integrated circuit architecture, thereby decreasing the amount of topside interconnect and thus reducing the potential for parasitics beneath tracks of surface metal.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A semiconductor structure comprising:
   a trench pattern formed in a semiconductor layer that is electrically isolated from an underlying substrate, said trench pattern subdividing said semiconductor layer into a plurality of spaced-apart, electrically isolated islands;
   an auxiliary trench region formed in a selected portion of said semiconductor layer spaced apart from said trench pattern;
   dielectric material formed on top surfaces of said semiconductor layer, and upon sidewalls of said trench pattern and said auxiliary trench region;
   electrically conductive material formed in said trench pattern and said auxiliary trench region;
   a first conductive layer overlying dielectric material atop the surface of said auxiliary trench region between first and second locations of electrically conductive material in said auxiliary trench region; and
   respective electrical connections between second and third conductive layers overlying said dielectric material and said first and second locations of electrically conductive material in said auxiliary trench region.

2. A semiconductor structure according to claim 1, wherein said auxiliary trench region is formed in an electrically isolated island.

3. A semiconductor structure according to claim 2, further including at least one semiconductor device region formed in the electrically isolated island in which said auxiliary trench region is formed.

4. A semiconductor structure according to claim 1, wherein a plurality of auxiliary trench regions are formed in said selected portion of said semiconductor layer.

5. A semiconductor structure comprising:
   a trench pattern formed in a semiconductor layer that is electrically isolated from an underlying substrate, said trench pattern subdividing said semiconductor layer into a plurality of spaced-apart, electrically isolated islands;
   an auxiliary trench region formed in a selected portion of said semiconductor layer spaced apart from said trench pattern;
   dielectric material formed on top surfaces of said semiconductor layer, and upon sidewalls of said trench pattern and said auxiliary trench region; and
   electrically conductive material formed in said trench pattern and said auxiliary trench region; and
   wherein said trench pattern and said auxiliary trench region are formed in a semiconductor layer that is dielectrically isolated from an underlying substrate, so that said semiconductor layer is subdivided into a plurality of spaced-apart, dielectrically isolated islands.

6. A semiconductor structure comprising:
   a trench pattern formed in a semiconductor layer that is electrically isolated from an underlying substrate, said trench pattern subdividing said semiconductor layer into a plurality of spaced-apart, electrically isolated islands;
   an auxiliary trench region formed in a selected portion of said semiconductor layer spaced apart from said trench pattern;
   dielectric material formed on top surfaces of said semiconductor layer, and upon sidewalls of said trench pattern and said auxiliary trench region; and
   electrically conductive material formed in said trench pattern and said auxiliary trench region; and
   wherein
   a plurality of auxiliary trench regions are formed in an electrically isolated island.

* * * * *